US006845109B2

(12) United States Patent
Lee et al.

(10) Patent No.: US 6,845,109 B2
(45) Date of Patent: Jan. 18, 2005

(54) METHOD FOR CORRECTING THE SHIFT OF OUTPUT WAVELENGTH OF LIGHT SOURCE

(75) Inventors: Jyung Chan Lee, Daejeon (KR); Seoung Il Myong, Daejeon (KR); Je Soo Ko, Daejeon (KR); Seon Mo Kang, Daejeon (KR)

(73) Assignee: Electronics & Telecommunications Research Institute (KR)

( * ) Notice: Subject to any disclaimer, the term of this patent is extended or adjusted under 35 U.S.C. 154(b) by 41 days.

(21) Appl. No.: 10/458,723

(22) Filed: Jun. 3, 2003

(65) Prior Publication Data

US 2004/0086007 A1 May 6, 2004

(30) Foreign Application Priority Data

Nov. 1, 2002 (KR) .............................. 10-2002-0067554

(51) Int. Cl.[7] ................................................ H01S 3/13
(52) U.S. Cl. ..................................... 372/29.02; 372/32
(58) Field of Search ............................. 372/32, 38.02, 372/38.07, 29.02, 34, 20

(56) References Cited

U.S. PATENT DOCUMENTS

| 4,890,922 | A | * | 1/1990 | Wilson ........................ 356/464 |
| 5,297,156 | A | * | 3/1994 | Deacon ........................ 372/21 |
| 5,982,800 | A | * | 11/1999 | Ishihara et al. ............... 372/57 |
| 6,043,915 | A | | 3/2000 | Giles et al. ................... 250/226 |
| 6,144,025 | A | | 11/2000 | Tei et al. ..................... 359/139 |
| 6,369,926 | B1 | | 4/2002 | Lyu et al. .................... 359/187 |
| 6,486,999 | B1 | * | 11/2002 | Ackerman et al. ........... 359/288 |
| 6,690,689 | B2 | * | 2/2004 | Ackerman et al. ............ 372/20 |

OTHER PUBLICATIONS

IPC Code: Nov. 15, 1999, Device For Fixing A Wavelength of Output Optical of Laser Diode, Korean Pat. Abstract.
K.J. Park et al., "A Multi–Wavelength Locker for WDM System" pp. WE4–1/73–WE4–3/75; Korea Advanced Institute of Science and Technology, Dept. of Electrical Engineering, no months & year.
H. Masuda et al., "Pump–Wavelength–Locked Erbium– Doped Fibre . . . " pp. 1855–1857; Electronics Letters Sep. 24, 1992; vol. 28, No. 20.
E.C. Vail, et al., "Widely Tunable Micromachined Detectors with Wavelength Tracking", pp. 303–304; Ginzton Laboratory, Stanford University (1:30pm–2:00pm(invited)109.1, no month & year.
G.E. Shtengel et al., "Simultaneous Laser Wavelength Locking . . . ", pp. 269–270; Lucent Technologies, Bell Laboratories (0–7803–4223–2/98; 1998 IEEE)

* cited by examiner

Primary Examiner—Don Wong
Assistant Examiner—Hung Tran Vy
(74) Attorney, Agent, or Firm—Blakely Sokoloff Taylor & Zafman

(57) ABSTRACT

The present invention provides a method for correcting a shift of an output wavelength of a light source. The output wavelength shift correcting method derives simple equations through experimental processes, predicts a shift degree of the output wavelength with respect to a varied input current using the equations whenever a drive current is reset later, and adjusts a drive temperature according to the predicted shift degree, thus correcting the shift of the output wavelength. The output wavelength shift correcting method is advantageous in that it provides a method of locking an output wavelength of each light source without continuously operating a wavelength locker or a wavelength measuring device, thus reducing the operating cost of the optical communication system.

4 Claims, 5 Drawing Sheets

| DRIVE CURRENT [mA] | OUTPUT WAVELENGTH [nm] |
|---|---|
| 20 | 1590.298 |
| 25 | 1590.337 |
| 30 | 1590.372 |
| 35 | 1590.415 |
| 40 | 1590.450 |
| 45 | 1590.485 |
| 50 | 1590.526 |
| 55 | 1590.568 |
| 60 | 1590.609 |
| 65 | 1590.652 |
| 70 | 1590.697 |
| 75 | 1590.750 |
| 80 | 1590.794 |
| 85 | 1590.844 |
| 90 | 1590.894 |
| 95 | 1590.951 |
| 100 | 1590.999 |
| 105 | 1591.060 |
| 110 | 1591.114 |
| 115 | 1591.174 |
| 120 | 1591.241 |

FIG. 3

| DRIVE TEMPERATURE [°C] | OUTPUT WAVELENGTH [nm] |
|---|---|
| 17 | 1589.696 |
| 19 | 1589.905 |
| 21 | 1590.118 |
| 23 | 1590.327 |
| 25 | 1590.526 |
| 27 | 1590.732 |
| 29 | 1590.936 |
| 31 | 1591.139 |
| 33 | 1591.341 |

FIG. 5

METHOD FOR CORRECTING THE SHIFT OF OUTPUT WAVELENGTH OF LIGHT SOURCE

BACKGROUND OF THE INVENTION

1. Field of the Invention

The present invention relates generally to a multi-channel optical signal transmission system for optical communication, and more particularly to a method for correcting the shift of an output wavelength generated when the intensity of output light of a light source is adjusted by a drive current of the light source in a multi-channel light source driving apparatus used in an optical communication system.

2. Description of the Related Art

Generally, optical communication technologies using optical fiber enable high speed and large capacity information transmission and do not cause signal interference or crosstalk due to electromagnetic induction, so they have been used in international communications through submarine cables. Recently, with the development of multiplexing technology and network technology, optical communication has been greatly extended in its application range to a backbone network for voice and data communications between private exchanges, and high speed wide band multimedia communications including cable television, video on demand (VOD), etc.

Typically, in optical communication, optical signals with different wavelengths, generated by and outputted from a plurality of laser diodes, are modulated, and the optical signals with different wavelengths are multiplexed and are transmitted to a destination through a predetermined optical line as a multiplexed optical signal. Further, at the destination, the multiplexed and transmitted optical signal is demultiplexed, such that a plurality of original optical signals with different wavelengths are restored from the multiplexed optical signal. At this time, in an optical communication system, certain specifications are proposed for the intensity of output light of a laser diode used as a light source, for example, a Distributed FeedBack-Laser Diode (DFB-LD), the wavelength of output light, the line width of the output light, a side mode suppression ratio, etc. Of these specifications, the intensity and wavelength of output light are varied in their characteristics according to a drive current by which the DFB-LD is driven and a drive temperature at which the DFB-LD is driven. For example, if the drive current is increased so as to increase the intensity of output light, the wavelength of output light is shifted to a long wavelength; while if the drive current is decreased so as to decrease the intensity of output light, the wavelength of output light is shifted to a short wavelength. As described above, if the wavelength is not uniform, original data cannot be easily restored at a corresponding destination, thus hindering normal information transmission.

In order to prevent such a wavelength shift phenomenon and maintain a uniform wavelength, a method of locking a wavelength continuously using a wavelength locker or wavelength measuring device is used in the prior art. A wavelength locking apparatus and method continuously using such a wavelength locker or wavelength measuring device is disclosed in U.S. Pat. No. 6,369,926, U.S. Pat. No. 6,144,025, U.S. Pat. No. 6,043,915, and Korean Pat. Appl. No. 10-1998-0015193.

However, the above method of locking a wavelength continuously using the wavelength locker or wavelength measuring device is problematic in that its implementation algorithm is complicated, and the operating cost of an optical signal transmission system is increased due to the continuous use of the wavelength locker or the wavelength measuring device.

SUMMARY OF THE INVENTION

Accordingly, the present invention has been made keeping in mind the above problems occurring in the prior art, and an object of the present invention is to provide a method for correcting the shift of an output wavelength of a light source, which formularizes a shift phenomenon of an output wavelength of a light source for optical communication through experimental processes, predicts a shift degree of the output wavelength with respect to a varied input current using equations obtained from the formularization, and adjusts a temperature according to the predicted shift degree, thus correcting the shift of the output wavelength.

In order to accomplish the above object, the present invention provides a method for correcting a shift of an output wavelength of a light source, the shift of the output wavelength being generated by adjustment of a drive current in the light source used in an optical communication system, comprising the steps of 1) setting an initial drive current and an initial drive temperature of the light source according to an output light intensity and an output wavelength which are previously set; 2) obtaining a correlation between a drive current and an output wavelength of the light source at the initial drive temperature, and calculating coefficients "a", "b", "c" and "d" of $y=ax^3+bx^2+cx+d$ (Equation [1]) using the correlation between the drive current and the output wavelength, where x is the drive current and y is the output wavelength; 3) obtaining a correlation between a drive temperature and the output wavelength of the light source at the initial drive current, and calculating coefficients "e" and "f" of $y=ez+f$ (Equation [2]) using the correlation between the drive temperature and the output wavelength, where y is the output wavelength and z is the drive temperature; and 4) calculating an output wavelength shifted by a reset drive current through the Equation [1] if the drive current is reset, calculating a wavelength difference between the set output wavelength based on the initial drive current and the shifted output wavelength, and calculating a reset drive temperature according to the wavelength difference using the initial drive temperature and the coefficient "e" of the Equation [2], thus resetting the drive temperature.

Further, in the present invention, the light source is a Distributed feedback-Laser Diode (DFB-LD).

Further, in the present invention, the reset drive temperature at step 4) is calculated by $$T_2 = T_1 - \left[\frac{(y_2 - y_1)}{e}\right], \qquad \text{(Equation [3])}$$

where $T_1$ is the initial drive temperature, $T_2$ is the reset drive temperature, $y_1$ is the set output wavelength, $y_2$ is the shifted output wavelength, $y_2-y_1$ is the wavelength difference and e is the coefficient of Equation [2].

BRIEF DESCRIPTION OF THE DRAWINGS

The above and other objects, features and other advantages of the present invention will be more clearly understood from the following detailed description taken in conjunction with the accompanying drawings, in which:

FIG. 3 is a table numerically expressing a relationship between a drive current and an output wavelength at a constant drive temperature of the light source;

FIG. 5 is a table numerically expressing a relationship between a drive temperature and an output wavelength at a constant drive current of the light source.

DESCRIPTION OF THE PREFERRED EMBODIMENTS

Hereinafter, embodiments of a method for correcting the shift of an output wavelength of a light source according to the present invention will be described in detail with reference to the attached drawings.

Figure 1:
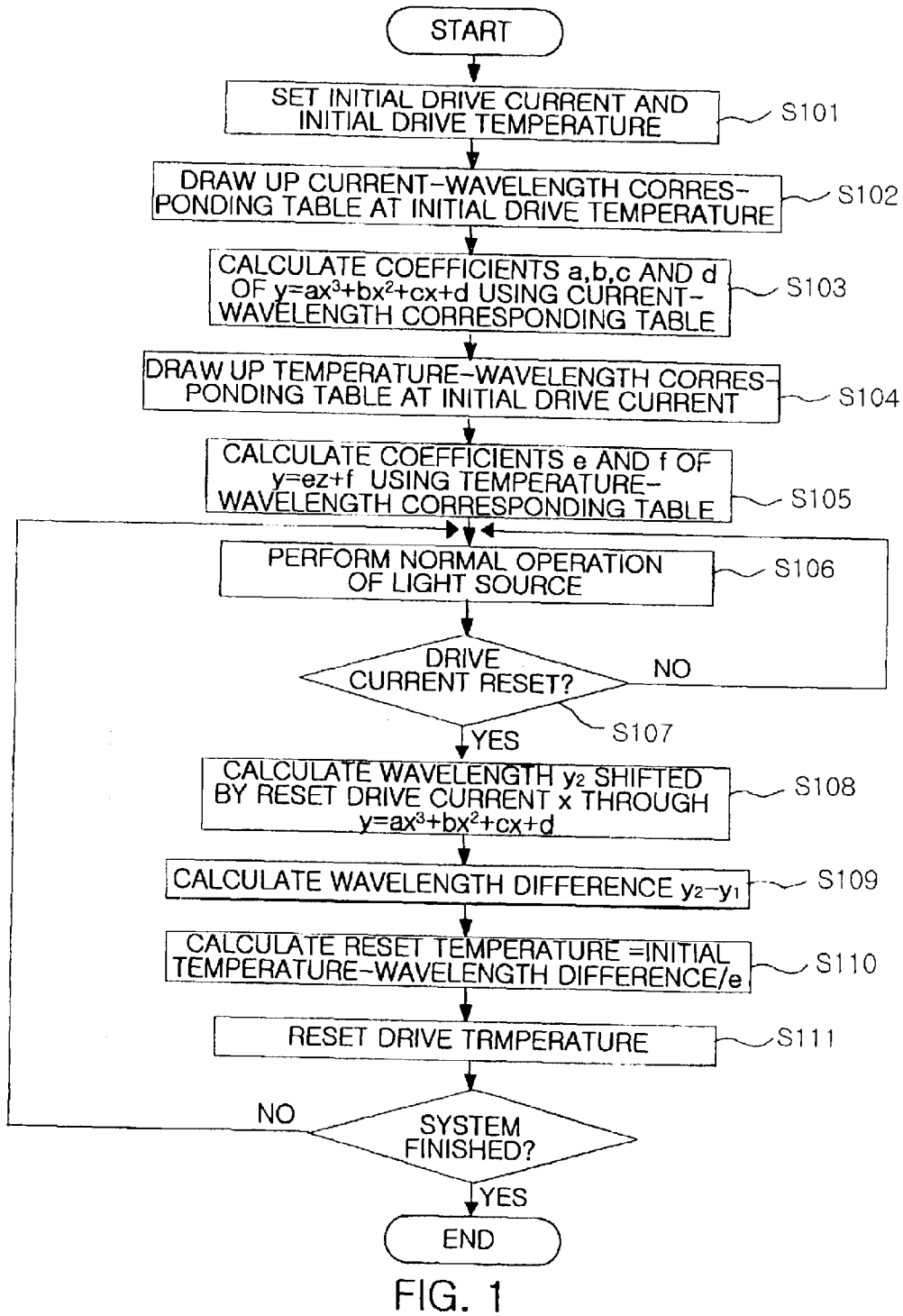
FIG. 1 is a flowchart of a method for correcting the shift of an output wavelength of a light source according to the present invention.

FIG. 1 is a flowchart of a method for correcting the shift of an output wavelength of a light source according to the present invention. Referring to FIG. 1, at the first step S101 of the output wavelength shift correcting method, an initial drive current and an initial drive temperature of a light source of a multi-channel light source driving apparatus used in an optical communication system are set on the basis of an output light intensity and an output wavelength which are previously set. In the optical communication system, a plurality of light sources of the multi-channel light source driving apparatus must generate and maintain different output wavelengths. For these operations, the initial drive current and the initial drive temperature suitable for the set output wavelength to be generated by each of the light sources must be set. In this case, each of the light sources preferably is a laser diode capable of correcting a wavelength of its output light, for example, a DFB-LD.

Thereafter, at the second step including steps S102 and S103 in the output wavelength shift correcting method of the present invention, a correlation between a drive current and an output wavelength of the light source at the initial drive temperature is obtained, and coefficients "a", "b", "c" and "d" of the following Equation [1] are calculated using the correlation between the drive current and the output wavelength, $$y = ax^3 + bx^2 + cx + d \quad [1]$$

where x is the drive current and y is the output wavelength.

Figure 2:
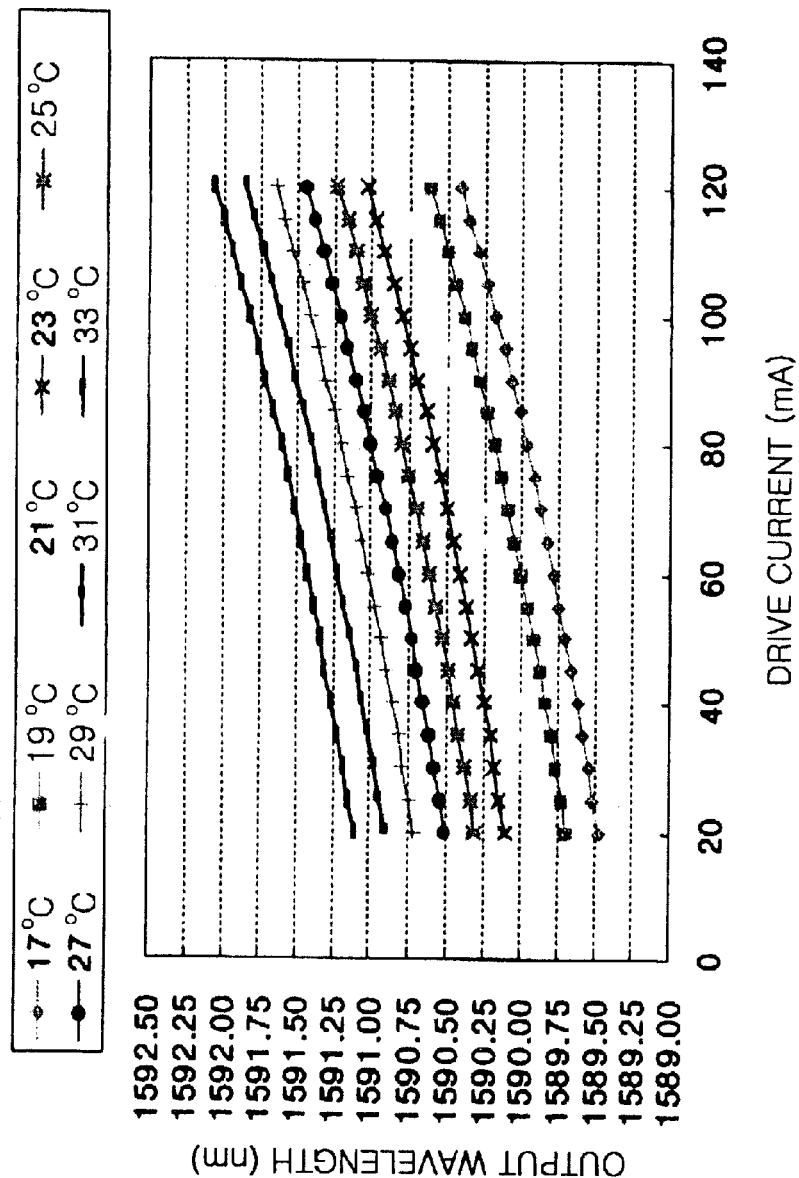
FIG. 2 is a graph showing a relationship between a drive current and an output wavelength of a light source.

FIG. 2 is a graph showing a relationship between the drive current and the output wavelength, which are two variables of Equation [1]. As shown in FIG. 2, it can be seen that the output wavelength according to the drive current is represented as same type curves, when a drive temperature varies. Equation [1] is derived from such an experimental process. At the second step, characteristics of the output wavelength according to the variation of the drive current are obtained by regularly varying the value of the drive current while maintaining the initial drive temperature set at the first step, so a correlation between the drive current and the output wavelength is obtained, and the coefficients "a"[11], "b", "c" and "d" of Equation [1] are then calculated using the correlation.

For example, if the initial drive temperature is 25° C., the correlation between the drive current and the output wavelength can be drawn up as a table of FIG. 3. In this case, if values of a drive current/output wavelength pair in this table are applied to Equation [1], the coefficients "a", "b", "c" and "d" of Equation [1] can be calculated.

After that, at the third step including steps S104 and S105 in the output wavelength shift correcting method of the present invention, a correlation between a drive temperature and the output wavelength of the light source at the initial drive current is obtained, and coefficients "e" and "f" of the following Equation [2] are calculated using the correlation between the drive temperature and the output wavelength, $$y = ez + f \quad [2]$$

where y is the output wavelength, and z is the drive temperature.

Figure 4:
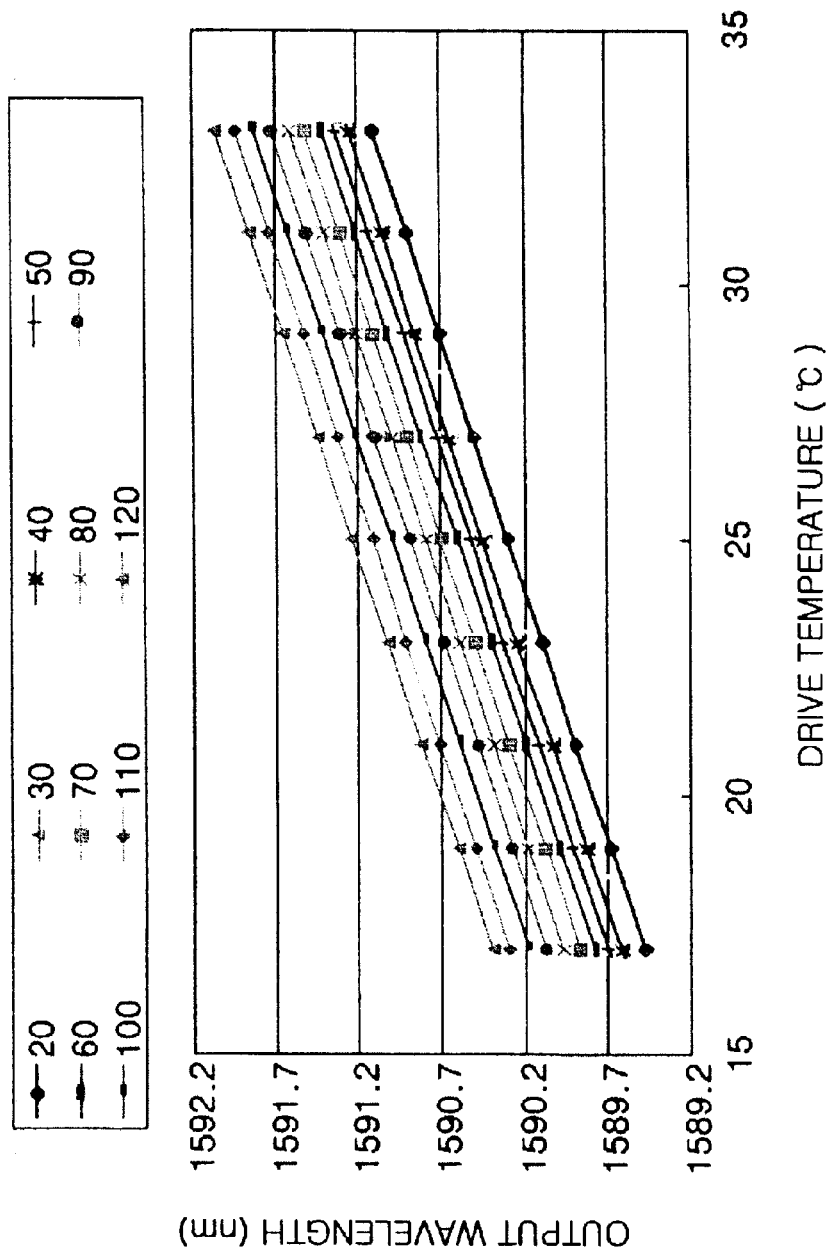
FIG. 4 is a graph showing a relationship between a drive temperature and an output wavelength of the light source.

FIG. 4 is a graph showing a relationship between the drive temperature and the output wavelength, which are two variables of Equation [2]. As shown in FIG. 4, it can be seen that the output wavelength according to the drive temperature represents linear characteristics having the same gradient, when the drive current varies. Equation [2] is derived from such an experimental process. At the third step, characteristics of the output wavelength according to the variation of the drive temperature are obtained by regularly varying the value of the drive temperature while maintaining the initial drive current set at the first step, so a correlation between the drive temperature and the output wavelength is obtained, and the coefficients "e" and "f" of Equation [2] are then calculated using the correlation.

For example, if the initial drive current is 50 mA, the correlation between the drive temperature and the output wavelength can be drawn up as a table of FIG. 5. In this case, if the values of a drive temperature/output wavelength pair in this table are applied to Equation [2], the coefficients "e" and "f" of Equation [2] can be calculated.

Thereafter, at the fourth step including steps S106, S107, S108, S109, S110 and S111 in the output wavelength shift correcting method of the present invention, an output wavelength shifted by a reset drive current is calculated through the Equation [1] if the drive current is reset so as to adjust the intensity of output light while the light source is normally operated. Further, at the fourth step, a wavelength difference between the set output wavelength based on the initial drive current and the shifted output wavelength is calculated, and a reset drive temperature based on the wavelength difference is calculated using the initial drive temperature and the coefficient "e" of Equation [2], thus resetting the drive temperature. Therefore, without requiring additional equipment, the shift of the output wavelength can be corrected by resetting the drive temperature at the fourth step through the calculation of simple equations.

The reset of the drive current is performed to increase or decrease the intensity of output light of the light source. First, the case where the drive current is increased to increase the intensity of output light is described. For example, provided that an initial drive current is $x_1$, an initial drive temperature is $T_1$, and a drive current is increased later and is reset to $x_2$ so as to increase the intensity of output light, a reset drive current $x_2$ is applied to Equation [1] defined at the second step, and a shifted output wavelength $y_2$ is calculated. Provided that an initially set output wavelength is $y_1$ and a reset drive temperature for correcting the shifted output wavelength $y_2$ to the initially set output wavelength $y_1$ is $T_2$, the drive temperature must be decreased from $T_1$ to $T_2$ in proportion to the increase of the output wavelength from $y_1$ to $y_2$. At this time, the ratio of the increased output wavelength to the decreased drive temperature corresponds to the coefficient "e" of Equation [2] obtained at the third step. In other words, the ratio can be expressed as an equation $(y_2-y_1)=e(T_1-T_2)$, and the following Equation [3] is derived if the equation is arranged. That is, the drive temperature to be reset is calculated by the Equation [3], and the drive temperature is reset to the calculated reset drive temperature, thus returning the shifted output wavelength $y_2$ to the initially set output wavelength $y_1$, and consequently correcting the shifted output wavelength.

$$T_2 = T_1 - \left[\frac{(y_2 - y_1)}{e}\right] \qquad [3]$$

Next, the case where the drive current is decreased to decrease the intensity of output light is described. It is assumed that an initial drive current is $x_1$, an initial drive temperature is $T_1$, and the drive current is decreased later and is reset to $x_2$ so as to decrease the intensity of output light. At this time, the reset drive current $x_2$ is applied to the Equation [1] defined at the second step, such that the shifted output wavelength $y_2$ is calculated. Provided that an initially set output wavelength is $y_1$, and a reset drive temperature for correcting the shifted output wavelength $y_2$ to the initially set output wavelength $y_1$ is $T_2$, the drive temperature must be increased from $T_1$ to $T_2$ in proportion to the decrease of the output wavelength from $y_1$ to $y_2$. At this time, the ratio of the decreased output wavelength to the increased drive temperature corresponds to the coefficient "e" of Equation [2] obtained at the third step. That is, the ratio can be expressed as an equation $(y_1-y_2)=e\ (T_2-T_1)$. If the equation is arranged, the above Equation [3] is derived as in the case of decreasing the drive temperature according to the increase of the output wavelength in the above example. That is, the drive temperature to be reset is calculated by the Equation [3], and the drive temperature is reset to the calculated reset drive temperature, thus returning the shifted output wavelength $y_2$ to the initially set output wavelength $y_1$, and consequently correcting the shifted output wavelength.

As described above, the output wavelength shift correcting method according to the present invention can be repeatedly performed whenever a drive current is reset.

As described above, the present invention provides a method for correcting the shift of an output wavelength of a light source, which derives simple equations through experimental processes, predicts a shift degree of the output wavelength with respect to a varied input current using the equations whenever a drive current is reset later, and adjusts a drive temperature according to the predicted shift degree, thus correcting the shift of the output wavelength. Therefore, the present invention is advantageous in that the output wavelength of each light source can be uniformly maintained in a multi-channel light source driving apparatus used in an optical communication system. Further, the present invention is advantageous in that it provides a method of locking an output wavelength of each light source without continuously operating a wavelength locker or a wavelength measuring device, thus reducing the operating cost of the optical communication system.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for correcting a shift of an output wavelength of a light source, the shift of the output wavelength being generated by adjustment of a drive current in the light source used in an optical communication system, comprising the steps of:

1) setting an initial drive current and an initial drive temperature of the light source according to an output light intensity and an output wavelength which are previously set;

2) obtaining a correlation between a drive current and an output wavelength of the light source at the initial drive temperature, and calculating coefficients "a", "b", "c" and "d" of the following Equation [1] using the correlation between the drive current and the output wavelength, where x is the drive current and y is the output wavelength;

$$y=ax^3+bx^2+cx+d \qquad [1]$$

3) obtaining a correlation between a drive temperature and the output wavelength of the light source at the initial drive current, and calculating coefficients "e" and "f" of the following Equation [2] using the correlation between the drive temperature and the output wavelength, where y is the output wavelength and z is the drive temperature; and $$y=ez+f \qquad [2]$$

4) calculating an output wavelength shifted by a reset drive current through the Equation [1] if the drive current is reset, calculating a wavelength difference between the set output wavelength based on the initial drive current and the shifted output wavelength, and calculating a reset drive temperature according to the wavelength difference using the initial drive temperature and the coefficient "e" of the Equation [2], thus resetting the drive temperature.

2. The output wavelength shift correcting method according to claim 1, wherein the light source is a Distributed feedback-Laser Diode (DFB-LD).

3. The output wavelength shift correcting method according to claim 1, wherein the reset drive temperature at step 4) is calculated by the following Equation [3]:

$$T_2 = T_1 - \left[\frac{(y_2 - y_1)}{e}\right] \qquad [3]$$

where $T_1$ is the initial drive temperature, $T_2$ is the reset drive temperature, $y_1$ is the set output wavelength, $y_2$ is the shifted output wavelength, $y_2-y_1$ is the wavelength difference and e is the coefficient of Equation [2].

4. The output wavelength shift correcting method according to claim 1, wherein the step 4) is repeatedly performed so as to adjust the output wavelength of the light source whenever the drive current is reset.

* * * * *